United States Patent
Honda et al.

(10) Patent No.: US 10,354,902 B2
(45) Date of Patent: Jul. 16, 2019

(54) CONVEYANCE SYSTEM

(71) Applicant: MURATA MACHINERY, LTD., Kyoto-shi, Kyoto (JP)

(72) Inventors: Osamu Honda, Toyohashi (JP); Keiji Yamada, Toyohashi (JP); Daisuke Ono, Toyohashi (JP); Takashi Nozawa, Toyohashi (JP)

(73) Assignee: MURATA MACHINERY, LTD., Kyoto (JP)

( * ) Notice: Subject to any disclaimer, the term of this patent is extended or adjusted under 35 U.S.C. 154(b) by 0 days.

(21) Appl. No.: 15/780,680

(22) PCT Filed: Oct. 13, 2016

(86) PCT No.: PCT/JP2016/080412
§ 371 (c)(1),
(2) Date: Jun. 1, 2018

(87) PCT Pub. No.: WO2017/098804
PCT Pub. Date: Jun. 15, 2017

(65) Prior Publication Data
US 2018/0350646 A1 Dec. 6, 2018

(30) Foreign Application Priority Data
Dec. 8, 2015 (JP) .................. 2015-239615

(51) Int. Cl.
*G06F 7/00* (2006.01)
*H01L 21/677* (2006.01)
(Continued)

(52) U.S. Cl.
CPC .......... *H01L 21/67754* (2013.01); *B65G 1/00* (2013.01); *H01L 21/677* (2013.01);
(Continued)

(58) Field of Classification Search
None
See application file for complete search history.

(56) References Cited

U.S. PATENT DOCUMENTS 7,037,172 B1 * 5/2006 Molnar ................. B24B 37/042
451/5
2006/0181699 A1 * 8/2006 Numakura ........ H01L 21/67167
356/237.2
(Continued)

FOREIGN PATENT DOCUMENTS

JP 2013-153193 A 8/2013

*Primary Examiner* — Yolanda R Cumbess
(74) *Attorney, Agent, or Firm* — Keating & Bennett, LLP

(57) ABSTRACT

A conveyance system includes a track, ceiling conveyance vehicles, storage apparatuses, and a conveyance controller configured or programmed to control operations of the ceiling conveyance vehicles and a local vehicle in accordance with an operation mode. The storage apparatus includes a storage plate and the local vehicle that transfer a FOUP between the storage plate and an apparatus port. The conveyance controller switches the operation mode among a first mode prohibiting transfer from the apparatus port to the storage plate by the local vehicle, a second mode prohibiting transfer to the storage plate by any of the ceiling conveyance vehicles and transfer from the storage plate to the apparatus port by the local vehicle, and a third mode that does not restrict transfer by the local vehicle.

8 Claims, 6 Drawing Sheets

(51) Int. Cl.
*B65G 1/00* (2006.01)
*B65G 43/00* (2006.01)

(52) U.S. Cl.
CPC .. *H01L 21/67724* (2013.01); *H01L 21/67763* (2013.01); *B65G 43/00* (2013.01)

(56) References Cited

U.S. PATENT DOCUMENTS

2008/0154392 A1* 6/2008 Maenishi ........... H05K 13/0853
  700/32
2010/0325860 A1* 12/2010 Maenishi ............. H05K 13/085
  29/407.01
2012/0275886 A1  11/2012 Ota

* cited by examiner

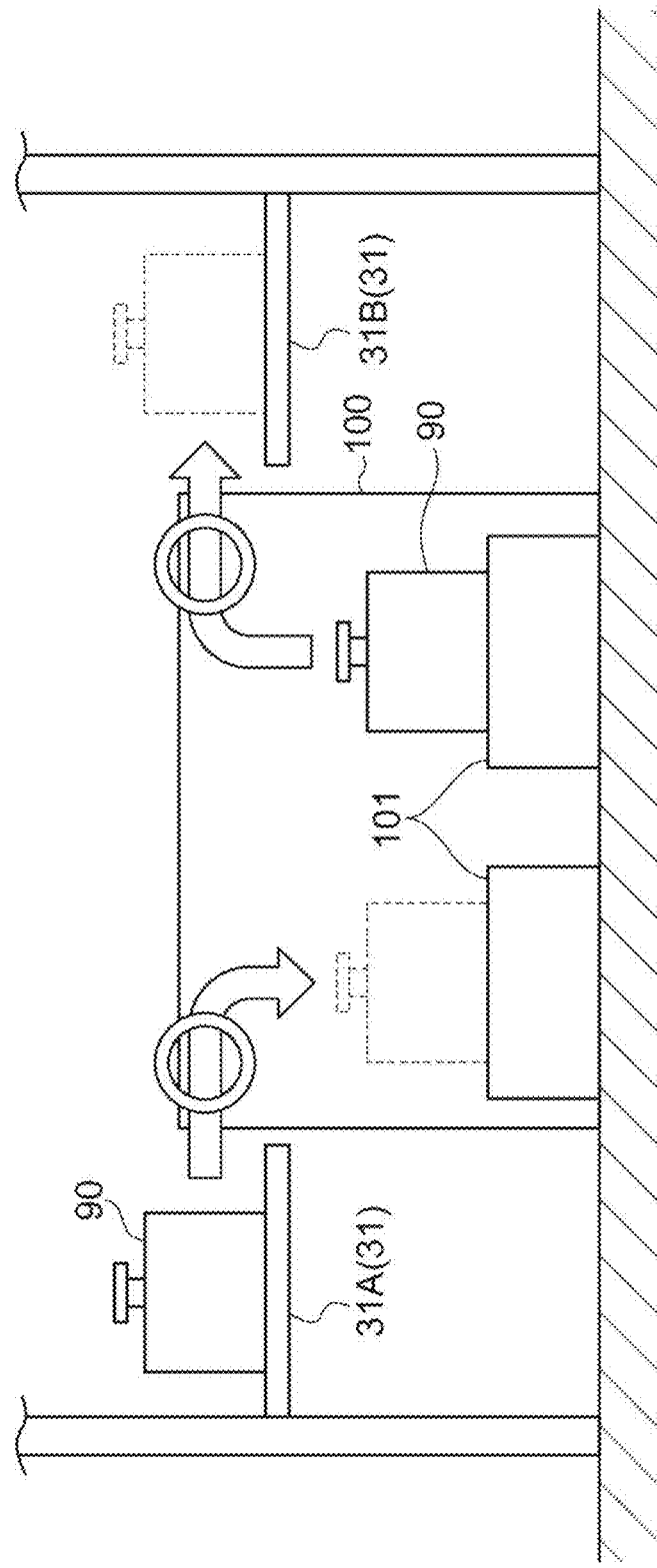

CONVEYANCE SYSTEM

BACKGROUND OF THE INVENTION

1. Field of the Invention

The present disclosure relates to a conveyance system.

2. Description of the Related Art

A known conveyance system includes a ceiling conveyance vehicle, a track as a traveling path for the conveyance vehicle, a storage part (a buffer) provided between the track and an apparatus port of a semiconductor processing apparatus, and a transfer mechanism (a local vehicle) delivering a conveyed object to and from the apparatus port and the storage part, as a conveyance system used for semiconductor manufacturing factories, for example (refer to Japanese Unexamined Patent Publication No. 2013-153193).

The conveyance system described in Japanese Unexamined Patent Publication No. 2013-153193 is configured to cause both the ceiling conveyance vehicle and the transfer mechanism to deliver the conveyed object to and from both the apparatus port and the storage part.

The conveyance system described above should be improved to increase the operating rate of the semiconductor processing apparatus. In such a system operating both the ceiling conveyance vehicle and the transfer mechanism as the conveyance system described above, the two are appropriately operated in accordance with the status of the conveyance system, whereby the operating rate of the semiconductor processing apparatus may improve.

SUMMARY OF THE INVENTION

Preferred embodiments of the present invention provide conveyance systems that improve operating rates of apparatuses in accordance with the status of the conveyance systems.

A conveyance system according to a preferred embodiment of the present invention includes a track, a plurality of conveyance vehicles to travel along the track and convey a conveyed object, a storage apparatus including a storage part to and from which any of the conveyance vehicles is capable of delivering the conveyed object and a transfer mechanism capable of transferring the conveyed object between the storage part and an apparatus port to and from which any of the conveyance vehicles is capable of delivering the conveyed object, and a controller configured or programmed to control operations of the conveyance vehicles and the transfer mechanism in accordance with a set operation mode. The controller is configured or programmed to switch the operation mode among a first mode that prohibits a transfer operation to transfer the conveyed object from the apparatus port to the storage part by the transfer mechanism, a second mode that prohibits a transfer operation to transfer the conveyed object to the storage part by any of the conveyance vehicles and a transfer operation to transfer the conveyed object from the storage part to the apparatus port by the transfer mechanism, and a third mode that allows both the transfer operation to transfer the conveyed object from the apparatus port to the storage part and the transfer operation to transfer the conveyed object from the storage part to the apparatus port by the transfer mechanism.

In the conveyance system, the controller preferably is configured or programmed to switch the operation mode among the first and second modes that restrict one of the transfer operations enabled by the transfer mechanism (that is, the transfer operation from the apparatus port to the storage part and the transfer operation from the storage part to the apparatus port) and the third mode that does not restrict the transfer operations of the transfer mechanism as the operation mode. The operation mode is set to the first mode in which supply of the conveyed object to the apparatus port is able to be prioritized. The operation mode is set to the second mode in which collection (evacuation to the storage part) of the conveyed object from the apparatus port is able to be prioritized. The operation mode is set to the third mode in which supply and collection of the conveyed object are able to be executed with a good balance. Consequently, the conveyance system switches the operation mode of the controller in accordance with the status of the conveyance system, and thus appropriately switches the priority of supply and collection of the conveyed object and improve the operating rate of the apparatus.

In the conveyance system, the storage part may include a first storage part provided on an upstream side of the apparatus port in a travel direction of the conveyance vehicles and a second storage part provided on a downstream side of the apparatus port in the travel direction of the conveyance vehicles. The controller may prohibit a transfer operation for the conveyed object to the second storage part by any of the conveyance vehicles and prohibit a transfer operation for the conveyed object from the apparatus port to the first storage part by the transfer mechanism. With this prohibition, in any of the first to the third modes, the conveyed object preferably is transferred in one direction from the upstream side to the downstream side in the travel direction of the conveyance vehicles. Consequently, in the range of transfer operations enabled in the respective modes, one conveyance vehicle is able to supply the conveyed object to an upstream port (the first storage part or the apparatus port) and collect a processed conveyed object placed on a downstream port (the apparatus port or the second storage part). Consequently, the conveyance system also improves the operating efficiency of the conveyance vehicles.

In the conveyance system, the controller may be configured or programmed to switch the operation mode for each of the storage apparatuses. With this configuration, the operation mode is able to be switched appropriately for each of the storage apparatuses in accordance with the status of each of the storage apparatuses.

In the conveyance system, the controller may be configured or programmed to receive an operation to request switching of the operation mode and switch the operation mode in accordance with the received operation. With this configuration, a manual operation by an operator or the like is able to timely switch the operation mode.

In the conveyance system, the controller may regularly acquire operation status information on an operation status of the conveyance system and automatically switch the operation mode based on the operation status information and a switching rule set in advance. With this configuration, switching to an appropriate operation mode is able to be achieved automatically in accordance with the operation status of the conveyance system.

In the conveyance system, the controller may acquire, as the operation status information, a processing time for one conveyed object at the apparatus port, execute a comparison operation based on the processing time and a threshold set in advance, and switch the operation mode for the storage apparatus allowing the conveyed object to be transferred to and from the apparatus port by the transfer mechanism based on a result of the comparison operation. With this configuration, simple processing to compare the processing time for one conveyed object at the apparatus port (or its average or the like) and the threshold set in advance is able to switch the operation modes of the respective storage apparatuses automatically and appropriately.

In the conveyance system, the controller may acquire, as the operation status information, the operating number of the conveyance vehicles in operation in a certain range of area containing the storage apparatus, execute a comparison operation based on the operating number and a threshold set in advance, and switch the operation mode for the storage apparatus based on a result of the comparison operation. With this configuration, simple processing to compare the operating number of the conveyance vehicles in operation in the certain range of area containing the storage apparatus and the threshold set in advance is able to switch the operation modes of the respective storage apparatuses automatically and appropriately.

In the conveyance system, the controller may acquire, as the operation status information, a vehicle allocating time of any of the conveyance vehicles collecting the conveyed object after being processed from the storage part of any of the storage apparatuses or the apparatus port allowing the conveyed object to be transferred to and from the storage part by the transfer mechanism, execute a comparison operation based on the vehicle allocating time and a threshold set in advance, and switch the operation mode for the storage apparatus based on a result of the comparison operation. With this configuration, simple processing to compare the vehicle allocating time of the conveyance vehicle collecting the conveyed object after being processed (or its average or the like) and the threshold set in advance is able to switch the operation modes of the respective storage apparatuses automatically and appropriately.

Preferred embodiments of the present invention provide conveyance systems that improve operating rates of apparatuses in accordance with a status of the conveyance systems.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6 is a schematic diagram for illustrating a third mode.

DETAILED DESCRIPTION OF THE PREFERRED EMBODIMENTS

The following describes preferred embodiments of the present invention in detail with reference to the accompanying drawings. In the description of the drawings, the same or similar components are denoted by the same symbols, and a duplicate description is omitted.

Figure 1:
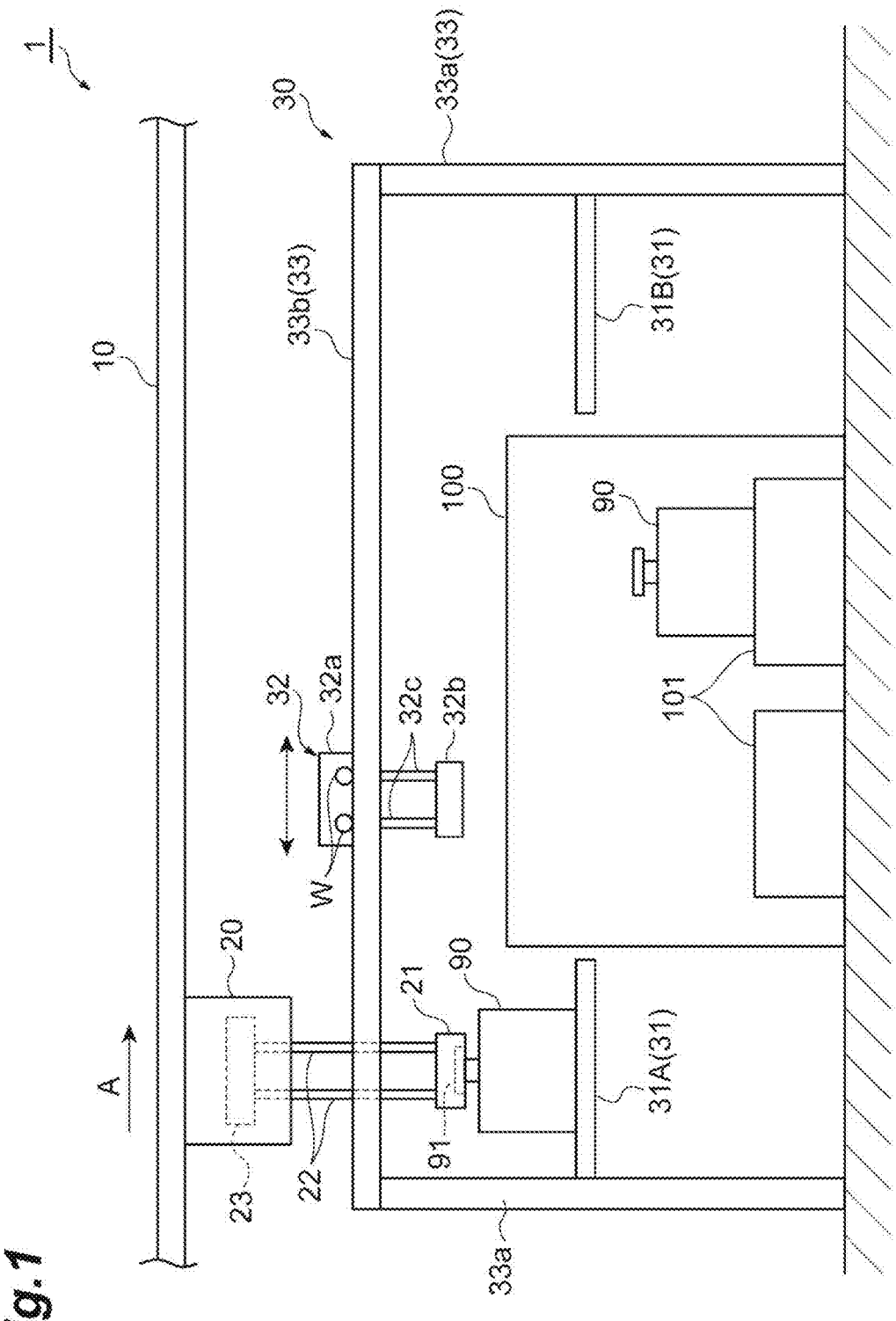
FIG. 1 is a diagram of a principal portion of a conveyance system of a preferred embodiment of the present invention.
Figure 2:
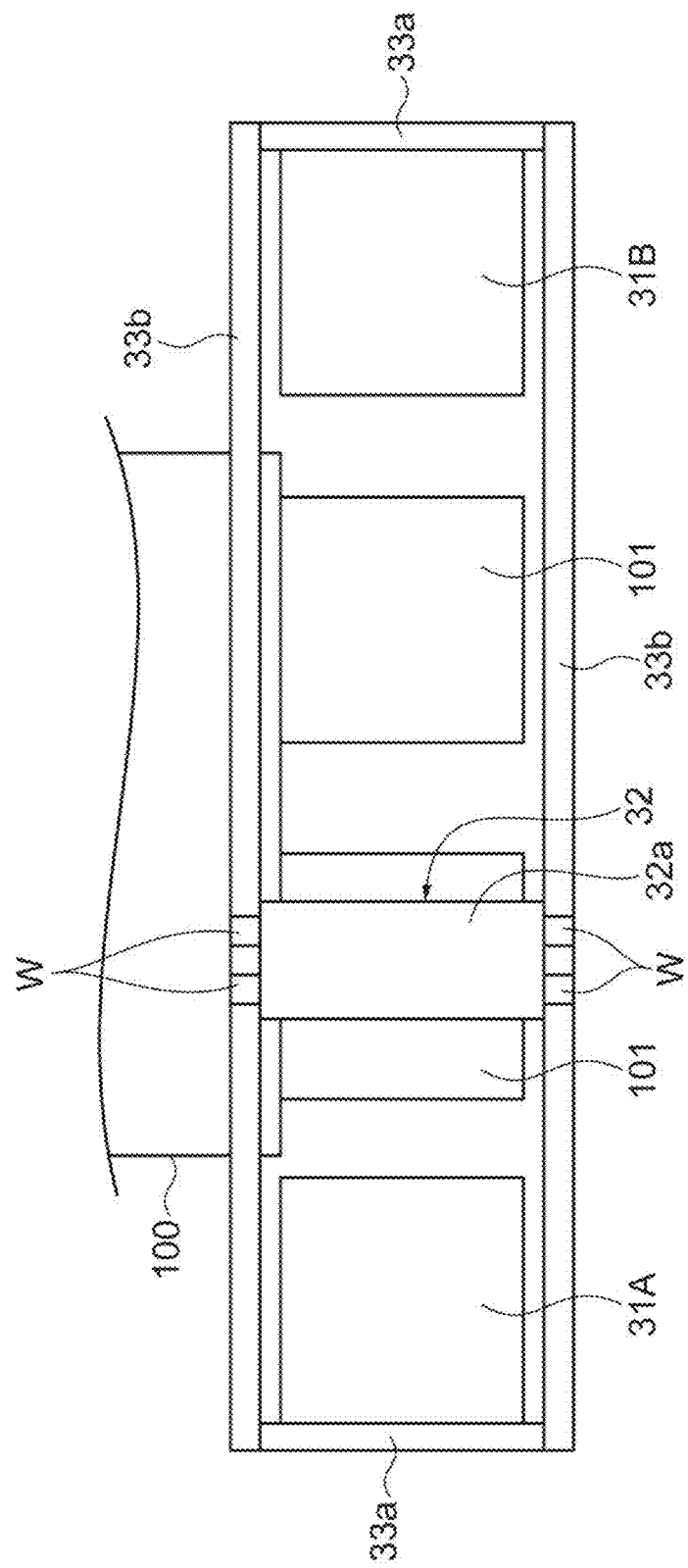
FIG. 2 is a plan view of a storage apparatus and a semiconductor processing apparatus in FIG. 1.

The following describes a conveyance system 1 of the present preferred embodiment with reference to FIG. 1 and FIG. 2. The conveyance system 1 is a system to convey a front opening unified pod (FOUP) housing a plurality of semiconductor wafers in a semiconductor manufacturing factory including a plurality of semiconductor processing apparatuses 100. As illustrated in FIG. 1, the conveyance system 1 includes a track 10, a plurality of ceiling conveyance vehicles 20, and storage apparatuses 30 installed corresponding to the respective semiconductor processing apparatuses 100. FIG. 1 illustrates a storage apparatus 30 corresponding to one semiconductor processing apparatus 100 among the semiconductor processing apparatuses 100 present in the semiconductor manufacturing factory.

The track 10 is preferably provided near a ceiling of the semiconductor manufacturing factory. Each of the ceiling conveyance vehicles 20 is an overhead hoist transfer (OHT) vehicle. The ceiling conveyance vehicle 20 travels in one direction along the track 10 while being hung by the track 10. Hereinafter, an upstream side and a downstream side in a travel direction A of the ceiling conveyance vehicle 20 will be referred to as an "upstream side" and a "downstream side," respectively.

The ceiling conveyance vehicle 20 conveys (supplies) a FOUP 90 housing a plurality of semiconductor wafers to an apparatus port 101 of each of the semiconductor processing apparatuses 100 or a storage part 31 described below. In the present preferred embodiment, as an example, two apparatus ports 101 are provided in a row in the travel direction A of the ceiling conveyance vehicle 20 for one semiconductor processing apparatus 100. The semiconductor processing apparatus 100 performs certain processing on the semiconductor wafers and the like housed in the FOUP 90 placed on the apparatus port 101. In the following description, the processing on the semiconductor wafers and the like housed in the FOUP 90 will be referred to simply as the processing on the FOUP 90. The FOUP 90 after the processing on the semiconductor wafers and the like housed therein has been executed will be referred to as the processed FOUP 90, for example. The processed FOUP 90 is collected by the ceiling conveyance vehicle 20 to be conveyed to an apparatus port or the like of the semiconductor processing apparatus 100 performing processing at the next process, for example. The processed FOUP 90 may be collected by the ceiling conveyance vehicle 20 from the apparatus port 101 or may be once evacuated to the storage part 31 and then be collected by the ceiling conveyance vehicle 20.

The ceiling conveyance vehicle 20 includes a grasping mechanism 21 capable of grasping a flange 91 of the FOUP 90 and a hoisting and lowering mechanism 23 capable of hoisting and lowering the grasping mechanism 21 by the drawing in and out of belts 22 to which the grasping mechanism 21 is connected. The ceiling conveyance vehicle 20 hoists and lowers the grasping mechanism 21 by the hoisting and lowering mechanism 23 to enable the FOUP 90 to be delivered to and from both the storage part 31 described below and the apparatus port 101.

The storage apparatus 30 includes two storage parts 31, a local vehicle (a transfer mechanism) 32, and a support member 33 supporting the storage part 31 and the local vehicle 32 as an example. The support member 33 includes a pair of side walls 33a and 33a erected on the ground so as to cause their principal surfaces to be opposite to each other in an extension direction of the track 10 and a pair of rail members 33b and 33b extending in the extension direction of the track 10 below the track 10. The pair of rail members 33b and 33b are opposite to each other in a direction orthogonal to the extension direction of the track 10 at the same height position. Respective both ends of each of the rail members 33b are supported by upper end surfaces of the pair of side walls 33a and 33a. The spacing between the rail members 33b and 33b defining a pair is set to a dimension that causes the FOUP 90 hoisted and lowered by the ceiling conveyance vehicle 20 not to interfere with the rail members 33b.

The storage part 31 preferably is a plate-shaped structure, or storage plate, horizontally extending so as to enable the FOUP 90 to be placed thereon. A first storage part 31A on the upstream side among the two storage parts 31 is fixed to a downstream side surface of the side wall 33a on the upstream side so as to be positioned on the upstream side of the two apparatus ports 101. A second storage part 31B on the downstream side among the two storage parts 31 is fixed to an upstream side surface of the side wall 33a on the downstream side so as to be positioned on the downstream side of the two apparatus ports 101.

The first storage part 31A on the upstream side defines and functions as a waiting place at which the FOUP 90 waiting for processing is caused to wait when there is no vacancy at the apparatus ports 101 (when the FOUP 90 is placed on each of the two apparatus ports 101 in the example in FIG. 1). The FOUP 90 waiting for processing is caused to wait at the first storage part 31A, such that when a vacancy occurs at any of the apparatus ports 101, the FOUP 90 waiting for processing is able to be immediately supplied to the apparatus port 101 from the first storage part 31A.

The second storage part 31B on the downstream side defines and functions as an evacuation place to which the processed FOUP 90 on which the processing by the semiconductor processing apparatus 100 has been completed is evacuated from the apparatus ports 101. The processed FOUP 90 is evacuated to the second storage part 31B, such that a situation in which the processed FOUP 90 is not collected by the ceiling conveyance vehicle 20 and remains placed on the apparatus port 101 to cause the apparatus port 101 to remain unable to be used is able to be eliminated.

The local vehicle 32 includes a vehicle body 32a on which wheels W are mounted. The local vehicle 32 includes a grasping mechanism 32b capable of grasping the flange 91 of the FOUP 90 and a hoisting and lowering mechanism (not illustrated) capable of hoisting and lowering the grasping mechanism 32b by the drawing in and out of belts 32c to which the grasping mechanism 32b is connected in the same manner as in the ceiling conveyance vehicle 20. The wheels W of the vehicle body 32a travel on the pair of rail members 33b and 33b, such that the local vehicle 32 freely moves along the pair of rail members 33b and 33b. The grasping mechanism 32b is hoisted and lowered by the hoisting and lowering mechanism, such that the local vehicle 32 is able to transfer the FOUP 90 to and from the storage part 31 and the apparatus port 101.

Figure 3:
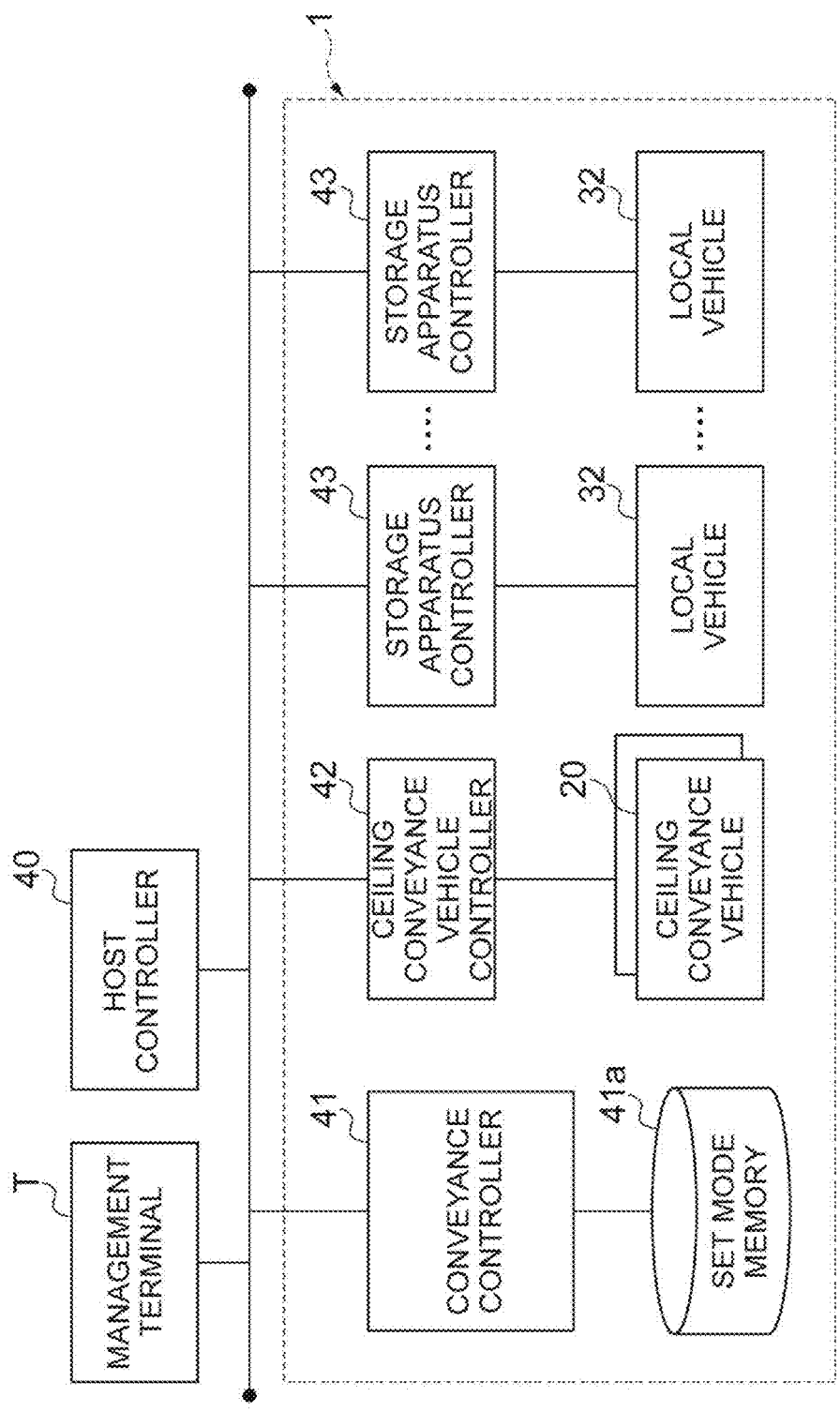
FIG. 3 is a block diagram of a control configuration of the conveyance system.

As illustrated in FIG. 3, the conveyance system 1 includes a conveyance controller 41, a ceiling conveyance vehicle controller 42 common to the ceiling conveyance vehicles 20, and a storage apparatus controller 43 provided in each of the storage apparatuses 30 as functional components managing a control system. The conveyance controller 41, the ceiling conveyance vehicle controller 42, and the storage apparatus controller 43 are each preferably a computer apparatus including a processor, a memory, a storage, and a communication device, for example. In each of the controllers, the processor executes certain software (a computer program) loaded into the memory or the like to control reading and writing of data in the memory and the storage and communication among the controllers by the communication devices, thus implementing functions of the respective controllers described below.

The conveyance controller 41 is a controller controlling operations of the ceiling conveyance vehicles 20 and the local vehicle 32 in accordance with an operation mode (described below in detail) set for each of the storage apparatuses 30 (that is, each of the semiconductor processing apparatuses 100). When controlling the operation of the ceiling conveyance vehicles 20, the conveyance controller 41 outputs a conveyance instruction for the FOUP 90 to the ceiling conveyance vehicle controller 42. When controlling the operation of the local vehicle 32, the conveyance controller 41 outputs a conveyance instruction for the FOUP 90 to the storage apparatus controller 43 controlling the storage apparatus 30 including the local vehicle 32.

The conveyance instruction is information instructing conveyance of the FOUP 90 as an object to be conveyed from a starting point (a conveyance source) to a destination (a conveyance destination). Specifically, the conveyance instruction is information associating information (ID) identifying the FOUP 90 to be conveyed, information (a From point) identifying a point (the apparatus port, the storage part, and the like) at which the FOUP 90 to be conveyed is grasped, and information (a To point) identifying a point (the apparatus port, the storage part, and the like) at which the FOUP 90 to be conveyed is unloaded with each other.

The conveyance controller 41 outputs the conveyance instruction to an appropriate controller based on a combination of the From point and the To point of the conveyance instruction. Specifically, if the combination of the From point and the To point is a combination that can be transferred by the local vehicle 32 within the same storage apparatus 30, the conveyance controller 41 outputs the conveyance instruction to the storage apparatus controller 43 corresponding to the storage apparatus 30. In contrast, if the combination of the From point and the To point is not a combination that can be transferred by the local vehicle 32 within the same storage apparatus 30 (in the case of conveyance between different semiconductor processing apparatuses 100, for example), the conveyance controller 41 outputs the conveyance instruction to the ceiling conveyance vehicle controller 42.

The conveyance instruction output by the conveyance controller 41 is generated based on a conveyance request from a host controller 40. The host controller 40 monitors the entire status of the semiconductor manufacturing factory to recognize a vacancy status of the apparatus port 101 of each of the semiconductor processing apparatuses 100 and the storage part 31. The host controller 40 also recognizes a processing status of each FOUP 90. The host controller 40 preferably is a computer apparatus including a processor, a memory, a storage, and a communication device, for example, in the same manner as the conveyance controller 41, the ceiling conveyance vehicle controller 42, and the storage apparatus controller 43.

Upon detecting that a vacancy has occurred in the apparatus port 101 of the semiconductor processing apparatus 100 or the first storage part 31A, for example, the host controller 40 outputs a conveyance request to instruct unload (supply) of a new FOUP 90 to the conveyance controller 41.

Upon detecting that the processed FOUP 90 has appeared on the apparatus port 101 of the semiconductor processing apparatus 100 (that is, that the processing of the semiconductor processing apparatus 100 on the FOUP 90 placed on the apparatus port 101 has been completed), for example, the host controller 40 outputs a conveyance request to instruct grasping (collection) of the processed FOUP 90 to the conveyance controller 41.

Upon receiving the conveyance request from the host controller 40 as exemplified above, the conveyance controller 41 determines which FOUP 90 will be conveyed from location to location based on the conveyance request and generates the conveyance instruction described above. The conveyance controller 41 performs matching on a supply request (a conveyance request to request supply) and a collection request (a conveyance request to request collection) received from the host controller 40 based on a rule programmed in advance to generate a conveyance instruction designating the From point and the To point, for example. The conveyance controller 41 outputs the thus generated conveyance instruction to the ceiling conveyance vehicle controller 42 or the storage apparatus controller 43.

The ceiling conveyance vehicle controller 42 is a single controller controlling the traveling operation of the ceiling conveyance vehicles 20 and, upon receiving the conveyance instruction (the ID, the From point, and the To point) from the conveyance controller 41, allocates the conveyance instruction to a specific ceiling conveyance vehicle 20. Specifically, the ceiling conveyance vehicle controller 42 determines a ceiling conveyance vehicle 20 that is caused to convey the FOUP 90 indicated in the conveyance instruction based on an allocation rule set in advance. The ceiling conveyance vehicle controller 42 then transmits a control signal so as to convey the FOUP 90 to the determined ceiling conveyance vehicle 20. The ceiling conveyance vehicle controller 42 allocates, to a ceiling conveyance vehicle 20 present at a position closest to the From point of a conveyance instruction to be allocated among the ceiling conveyance vehicles 20 to which no conveyance instruction has been currently allocated, the conveyance instruction to be allocated, for example. The ceiling conveyance vehicle controller 42 is also able to allocate, even to a ceiling conveyance vehicle 20 that is executing another conveyance instruction, the ceiling conveyance vehicle 20 that is conveying the FOUP 90 with a point within a certain range of the From point of the conveyance instruction to be allocated as the To point, a conveyance instruction instructing "execution of the conveyance instruction to be allocated after the conveyance instruction currently being executed" (a conveyance instruction reservation).

The ceiling conveyance vehicle 20 to which the conveyance instruction has been allocated starts a traveling operation so as to execute the conveyance processing based on the conveyance instruction. However, the ceiling conveyance vehicle 20 to which the conveyance instruction reservation has been allocated starts a traveling operation so as to execute conveyance processing based on the conveyance instruction reservation after the completion of the conveyance processing based on the conveyance instruction currently being executed. Specifically, the ceiling conveyance vehicle 20 starts traveling toward the From point and, upon reaching the From point, grasps the FOUP 90 identified by the ID of the conveyance instruction. The ceiling conveyance vehicle 20 then starts traveling toward a position indicated by the To point and, upon reaching the position indicated by the To point, unloads the grasped FOUP 90. By such a series of operations, the FOUP 90 identified by the ID of the conveyance instruction is conveyed from the From point to the To point.

Upon receiving the conveyance instruction (the ID, the From point, and the To point) from the conveyance controller 41, the storage apparatus controller 43 transmits a control signal so as to execute the conveyance processing based on the conveyance instruction to the local vehicle 32 of a storage apparatus 30 to be controlled. With this operation, the local vehicle 32 starts a traveling operation so as to execute the conveyance processing based on the conveyance instruction in the same manner as the ceiling conveyance vehicle 20 to which the conveyance instruction has been allocated described above. Specifically, the local vehicle 32 starts traveling toward the From point and, upon reaching the From point, grasps the FOUP 90 identified by the ID of the conveyance instruction. The local vehicle 32 then starts traveling toward a position indicated by the To point and, upon reaching the position indicated by the To point, unloads the grasped FOUP 90.

The storage apparatus controller 43 monitors a vacancy status of the storage part 31 of the storage apparatus 30 to be controlled by a sensor or the like (not illustrated) and successively transmits monitored results to the conveyance controller 41. With this operation, the conveyance controller 41 is able to recognize the vacancy status of the storage part 31 of each of the storage apparatuses 30.

The following describes a configuration in which the conveyance controller 41 outputs the conveyance instruction corresponding to the operation mode set for each of the storage apparatuses 30. The operation mode set for each of the storage apparatuses 30 is stored in a set mode memory 41a to which the conveyance controller 41 can refer. Three modes including a first mode to a third mode are prepared as the operation mode that are able to be set for each of the storage apparatuses 30. The following first describes control common to the modes in the present preferred embodiment and then describes the modes with reference to FIG. 4 to FIG. 6.

Concerning the apparatus port 101 provided corresponding to each of the semiconductor processing apparatuses 100, the first storage part 31A, and the second storage part 31B, the conveyance controller 41 prohibits a transfer operation to transfer the FOUP 90 to the second storage part 31B by the ceiling conveyance vehicle 20 and prohibits a transfer operation to transfer the FOUP 90 from the apparatus port 101 to the first storage part 31A by the local vehicle 32. In other words, the conveyance controller 41 does not output a conveyance instruction instructing transfer of the FOUP 90 in a direction ascending from the downstream side to the upstream side (and a transfer operation causing the necessity to perform such transfer of the FOUP 90 from the downstream side to the upstream side) to the ceiling conveyance vehicle controller 42 and the storage apparatus controller 43.

With this prohibition, it is possible that the FOUP 90 is transferred in one direction from the upstream side to the downstream side. Consequently, in the range of transfer operations enabled in the respective modes described below, one ceiling conveyance vehicle 20 is able to supply the FOUP 90 to the upstream port (the first storage part 31A or the apparatus port 101) and collect the processed FOUP 90 placed on the downstream port (the apparatus port 101 or the second storage part 31B). Consequently, the conveyance controller 41 restricts output of the conveyance instruction as described above and is thus able to also improve the operating efficiency of the ceiling conveyance vehicles 20.

Figure 4:
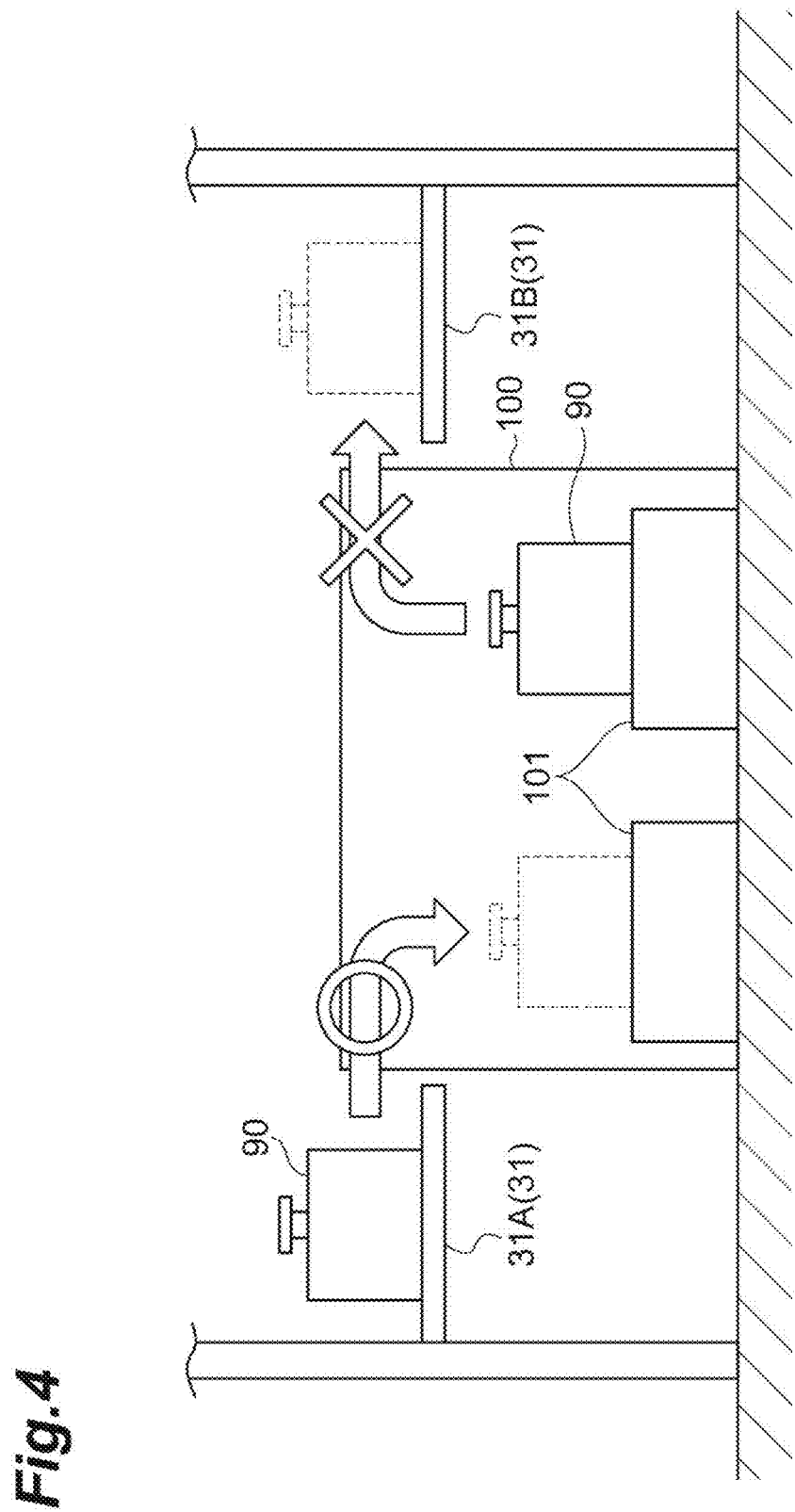
FIG. 4 is a schematic diagram for illustrating a first mode.

As illustrated in FIG. 4, the first mode is a mode that prohibits, out of the transfer operations enabled by the local vehicle 32 (that is, the transfer operation from the apparatus port 101 to the storage part 31 and the transfer operation from the storage part 31 to the apparatus port 101), the transfer operation to transfer the FOUP 90 from the apparatus port 101 to the storage part 31. Specifically, the conveyance controller 41 does not output a conveyance instruction instructing transfer of the FOUP 90 from the apparatus port 101 to the second storage part 31B (that is, a conveyance instruction in which the From point is the apparatus port 101, whereas the To point is the second storage part 31B) to the storage apparatus controller 43 that controls any of the storage apparatuses 30 with the first mode set as the operation mode. More specifically, even if receiving a collection request for the processed FOUP 90 placed on the apparatus port 101 and a supply request for the FOUP 90 to the second storage part 31B from the host controller 40, for example, the conveyance controller 41 does not output a conveyance instruction instructing transfer of the processed FOUP 90 placed on the apparatus port 101 to the second storage part 31B to the storage apparatus controller 43.

In the first mode, the local vehicle 32 exclusively executes supply of the FOUP 90 from the first storage part 31A to the apparatus port 101. With this operation, the efficiency of supplying the FOUP 90 to the apparatus port 101, which has become a vacant port, is able to be improved compared with a case in which the local vehicle 32 also executes the transfer operation from the apparatus port 101 to the second storage part 31B. Consequently, when a processing time at the apparatus port 101 is short, and when the efficiency of collecting the processed FOUP 90 is high, for example, the first mode is set. As a result, supply of the FOUP 90 to the apparatus port 101 is smoothly executed, and the operating rate of the semiconductor processing apparatus 100 is improved.

The case in which the efficiency of collecting the processed FOUP 90 is high is a case in which the semiconductor processing apparatus 100 is present in an area in which the operating number of the ceiling conveyance vehicles 20 in operation is large, and a ceiling conveyance vehicle 20 to collect the FOUP 90 is able to be allocated in a relatively short time, for example. The allocation of the ceiling conveyance vehicle 20 collecting the FOUP 90 is performed as follows, for example. Specifically, first, the host controller 40 outputs a collection request to instruct collection of the processed FOUP 90 to the conveyance controller 41. Next, the conveyance controller 41 outputs a conveyance instruction generated based on the collection request to the ceiling conveyance vehicle controller 42. Next, the ceiling conveyance vehicle controller 42 allocates the conveyance instruction to one ceiling conveyance vehicle 20. In this process, if there is no ceiling conveyance vehicle 20 to which no conveyance instruction has been currently allocated, the ceiling conveyance vehicle controller 42 waits for the appearance of a ceiling conveyance vehicle 20 that has completed the conveyance processing based on the conveyance instruction currently being allocated to become free, for example. Alternatively, the ceiling conveyance vehicle controller 42 reserves the conveyance instruction to be allocated as a next conveyance instruction for a ceiling conveyance vehicle 20 that is executing another conveyance instruction. In such a case, time may be taken until the processed FOUP 90 has been collected. When the operating number of the ceiling conveyance vehicles 20 in operation is large, for example, a ceiling conveyance vehicle 20 to which no conveyance instruction has been allocated is easily found, and the conveyance instruction is allocated to such a ceiling conveyance vehicle 20, such that the processed FOUP 90 is expected to be collected in a relatively short time.

Figure 5:
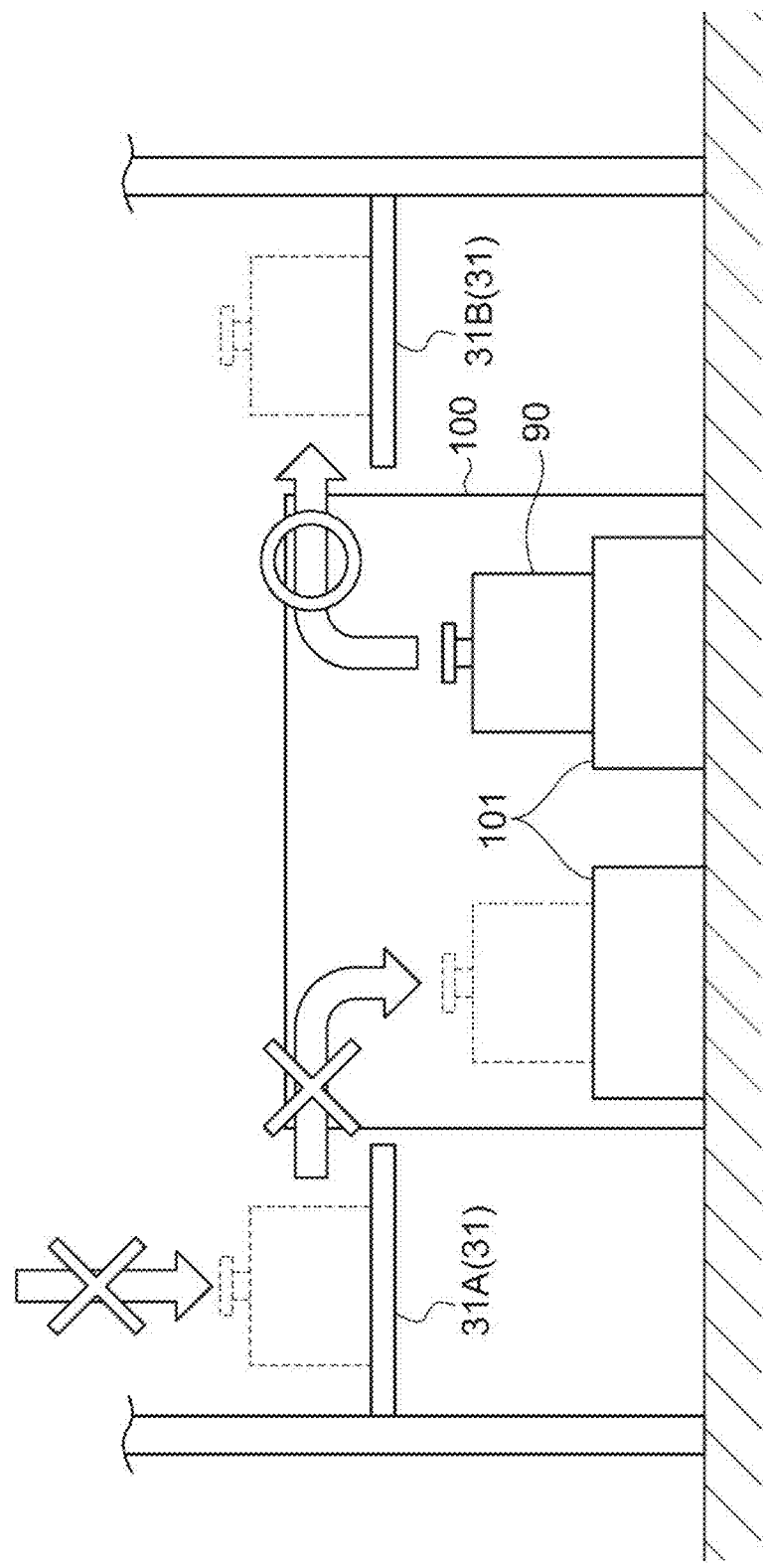
FIG. 5 is a schematic diagram for illustrating a second mode.

As illustrated in FIG. 5, the second mode is a mode that prohibits, out of the transfer operations enabled by the local vehicle 32, the transfer operation to transfer the FOUP 90 from the storage part 31 to the apparatus port 101 contrary to the first mode. Specifically, the conveyance controller 41 does not output a conveyance instruction instructing transfer of the FOUP 90 from the first storage part 31A to the apparatus port 101 (that is, a conveyance instruction in which the From point is the first storage part 31A, whereas the To point is the apparatus port 101) to the storage apparatus controller 43 that controls any of the storage apparatuses 30 with the second mode set as the operation mode. With the restriction on the transfer operation of the local vehicle 32, the FOUP 90 placed on the first storage part 31A is not transferred by the local vehicle 32. Consequently, the conveyance controller 41 does not output a conveyance instruction instructing transfer of the FOUP 90 to the first storage part 31A by the ceiling conveyance vehicle 20 (that is, a conveyance instruction in which the To point is the first storage part 31A), either. In other words, even if receiving a supply request for the FOUP 90 to the first storage part 31A from the host controller 40, for example, the conveyance controller 41 does not output a conveyance instruction based on the supply request (the conveyance instruction in which the To point is the first storage part 31A) to the ceiling conveyance vehicle controller 42.

In the second mode, the local vehicle 32 exclusively executes evacuation of the FOUP 90 from the apparatus port 101 to the second storage part 31B (collection of the FOUP 90 from the apparatus port 101). With this operation, the efficiency of collecting the processed FOUP 90 from the apparatus port 101 is improved compared with a case in which the local vehicle 32 also executes the transfer operation from the first storage part 31A to the apparatus port 101. Consequently, when the efficiency of collecting the processed FOUP 90 is low, for example, the second mode is set such that collection of the FOUP 90 from the apparatus port 101 is able to be smoothly executed. With this operation, an unprocessed FOUP 90 is able to be transferred to the apparatus port 101, which has become a vacant port, and the operating rate of the semiconductor processing apparatus 100 is improved. Examples of the case in which the efficiency of collecting the processed FOUP 90 is low include a case in which the semiconductor processing apparatus 100 is present in an area in which the operating number of the ceiling conveyance vehicles 20 in operation is small, and the ceiling conveyance vehicle 20 to collect the FOUP 90 cannot be allocated in a short time.

As illustrated in FIG. 6, the third mode is a mode that does not restrict the transfer operations enabled by the local vehicle 32 unlike the first mode and the second mode. In other words, the third mode is a mode that allows both the transfer operation to transfer the FOUP 90 from the apparatus port 101 to the second storage part 31B and the transfer operation to transfer the FOUP 90 from the first storage part 31A to the apparatus port 101 by the local vehicle 32. Specifically, the conveyance controller 41 is able to output a conveyance instruction instructing transfer from the first storage part 31A to the apparatus port 101 and to output a conveyance instruction instructing transfer from the apparatus port 101 to the second storage part 31B to the storage apparatus controller 43 that controls any of the storage apparatuses 30 with the third mode set as the operation mode. In other words, in the third mode, the local vehicle 32 is able to execute both supply of the FOUP 90 from the first storage part 31A to the apparatus port 101 and collection of the FOUP 90 from the apparatus port 101 to the second storage part 31B. Consequently, it can be said that the third mode is a mode that does not require to prioritize either supply of the FOUP 90 or collection of the FOUP 90 and is appropriate for a situation in which the two are desired to be executed with a good balance.

Upon receiving an operation to request switching of the operation mode, the conveyance controller 41 is able to switch the operation mode in accordance with the operation. As illustrated in FIG. 3, for example, manual switching of the operation mode (a setting change from the first mode to the second mode, for example) for each of the storage apparatuses 30 is enabled via a management terminal T communicably connected to the conveyance controller 41. Specifically, an operator performs an input operation using an input device such as a keyboard while watching a setting screen for the operation mode displayed on the management terminal T and is thus able to change operation mode settings for each of the storage apparatuses 30. When such an operator's operation is performed, the operation mode of a storage apparatus 30 to be switched among the operation modes set for each of the storage apparatuses 30 stored in the set mode memory 41a is changed to a mode designated by the operator's operation (any of the first to the third modes). Consequently, the conveyance controller 41 outputs a conveyance instruction based on the operation mode after being changed for the storage apparatus 30 for which the operation mode has been changed.

When feeling that a tendency in which the processed FOUP 90 is left on the apparatus port 101 for a long time has become noticeable for a semiconductor processing apparatus 100, for example, the operator sets the operation mode of the storage apparatus 30 corresponding to the semiconductor processing apparatus 100 to the second mode to increase the efficiency of collecting the FOUP 90 from the apparatus port 101. In contrast, when feeling that a time during which the apparatus port 101 is vacant has become longer for a semiconductor processing apparatus 100, the operator sets the operation mode of the storage apparatus 30 corresponding to the semiconductor processing apparatus 100 to the first mode to increase the efficiency of supplying the FOUP 90 to the apparatus port 101.

The conveyance controller 41 may be configured or programmed to regularly acquire operation status information on an operation status of the conveyance system 1 and to automatically switch the operation mode based on the operation status information and a switching rule set in advance. Examples of the operation status information include an average processing time (a cycle time) for one FOUP 90 of the semiconductor processing apparatus 100 corresponding to each of the storage apparatuses 30, the operating number of the ceiling conveyance vehicles 20 in operation in a surrounding area of each of the semiconductor processing apparatuses 100, and an average vehicle allocating time until the ceiling conveyance vehicle 20 collecting the processed FOUP 90 on the apparatus port 101 has been allocated in each of the semiconductor processing apparatuses 100. The method for acquiring such operation status information by the conveyance controller 41 is not limited to a particular method; the conveyance controller 41 is able to acquire the operation status information through communication with the host controller 40 or the ceiling conveyance vehicle controller 42, for example. The following describes specific examples (first to third examples) of the operation status information and the switching rule.

First Example

When the processing time for one FOUP 90 of the semiconductor processing apparatus 100 (that is, the processing time for one FOUP 90 on the apparatus port 101 of the semiconductor processing apparatus 100) is short, the frequency of occurrence of the processed FOUP 90 on the apparatus port 101 increases. For this reason, the operating rate of the semiconductor processing apparatus 100 may improve by prioritizing collection of the processed FOUP 90 from the apparatus port 101 rather than supply of the unprocessed FOUP 90 to the apparatus port 101. Consequently, it can be said in such a case that the operation mode is preferably set to the second mode. Given these circumstances, the conveyance controller 41 regularly acquires the processing time for each FOUP 90 of the semiconductor processing apparatus 100 for each of the semiconductor processing apparatuses 100 and switches the operation mode of the storage apparatus 30 corresponding to the semiconductor processing apparatus 100 to the second mode if the average of the processing time (the average processing time) is smaller than a threshold d1 set in advance.

In contrast, when the processing time of the semiconductor processing apparatus 100 is long, while the frequency of occurrence of the processed FOUP 90 on the apparatus port 101 decreases, it is of particular importance to supply the unprocessed FOUP 90 to the semiconductor processing apparatus 100 immediately when a vacant port occurs in order to improve the operating rate of the semiconductor processing apparatus 100. In other words, the operating rate of the semiconductor processing apparatus 100 may improve by prioritizing supply of the unprocessed FOUP 90 to the apparatus port 101 rather than collection of the processed FOUP 90 from the apparatus port 101. Consequently, it can be said in such a case that the operation mode is preferably set to the first mode. Given these circumstances, the conveyance controller 41 switches the operation mode of the storage apparatus 30 corresponding to the semiconductor processing apparatus 100 to the first mode if the average processing time of the semiconductor processing apparatus 100 is larger than a threshold d2 (d2>d1) set in advance.

If the average processing time of the semiconductor processing apparatus 100 falls between the threshold d1 and the threshold d2, the conveyance controller 41 switches the operation mode of the storage apparatus 30 corresponding to the semiconductor processing apparatus 100 to the third mode in order to perform supply and collection of the FOUP 90 with a good balance.

In the first example described above, the average processing time of the semiconductor processing apparatus 100 corresponds to the operation status information, whereas the rule described above setting any of the first to the third modes based on the average processing time and the result of the comparison operation with the thresholds d1 and d2 corresponds to the switching rule. In the first example described above, a processing time for one FOUP 90 freely selected may be used in place of the average processing time. A representative value other than the average processing time (the median of the processing time, for example) may be used.

Second Example

When the operating number of the ceiling conveyance vehicles 20 in operation in the surrounding area of the semiconductor processing apparatus 100 (that is, a certain range of area containing the storage apparatus 30 provided corresponding to the semiconductor processing apparatus 100) is sufficiently large, it is highly possible for the ceiling conveyance vehicle 20 collecting the processed FOUP 90 on the apparatus port 101 to be able to be allocated in a short time for the reason described above. In such a case, the operating rate of the semiconductor processing apparatus 100 may improve by prioritizing supply of the unprocessed FOUP 90 to the apparatus port 101 rather than collection of the processed FOUP 90 from the apparatus port 101. Consequently, it can be said in such a case that the operation mode is preferably set to the first mode. Given these circumstances, the conveyance controller 41 regularly acquires the operating number of the ceiling conveyance vehicles 20 in operation in the surrounding area of the semiconductor processing apparatus 100 for each of the semiconductor processing apparatuses 100 and switches the operation mode of the storage apparatus 30 corresponding to the semiconductor processing apparatus 100 to the first mode if the operating number is larger than a threshold d3 set in advance.

In contrast, when the operating number of the ceiling conveyance vehicles 20 in operation in the surrounding area of the semiconductor processing apparatus 100 is small, a situation can occur in which the processed FOUP 90 on the apparatus port 101 is not collected for a protracted period. In such a case, the operating rate of the semiconductor processing apparatus 100 may improve by prioritizing collection of the processed FOUP 90 from the apparatus port 101 rather than supply of the unprocessed FOUP 90 to the apparatus port 101. Consequently, it can be said in such a case that the operation mode is preferably set to the second mode. Given these circumstances, the conveyance controller 41 switches the operation mode of the storage apparatus 30 corresponding to the semiconductor processing apparatus 100 to the second mode if the operating number of the ceiling conveyance vehicles 20 in operation in the surrounding area of the semiconductor processing apparatus 100 is smaller than a threshold d4 (d4<d3) set in advance.

If the operating number of the ceiling conveyance vehicles 20 in operation in the surrounding area of the semiconductor processing apparatus 100 falls between the threshold d3 and the threshold d4, the conveyance controller 41 switches the operation mode of the storage apparatus 30 corresponding to the semiconductor processing apparatus 100 to the third mode in order to perform supply and collection of the FOUP 90 with a good balance.

In the second example described above, the operating number of the ceiling conveyance vehicles 20 in operation in the surrounding area of the semiconductor processing apparatus 100 corresponds to the operation status information, whereas the rule described above setting any of the first to the third modes based on the operating number and the result of the comparison operation with the thresholds d3 and d4 corresponds to the switching rule.

Third Example

The second example described above estimates whether the ceiling conveyance vehicle 20 collecting the FOUP 90 can be allocated in a short time from the operating number of the ceiling conveyance vehicles 20 in operation in the surrounding area of the semiconductor processing apparatus 100 and performs mode switching based on its estimation result. In contrast, the third example measures an actual vehicle allocating time of the ceiling conveyance vehicle 20 collecting the processed FOUP 90 placed on the apparatus port 101 or the second storage part 31B and performs mode switching based on its average (the average vehicle allocating time). The vehicle allocating time of the ceiling conveyance vehicle 20 collecting the FOUP 90 is a time from when the ceiling conveyance vehicle controller 42 that had received a conveyance instruction instructing collection of the FOUP 90 allocated the conveyance instruction to the ceiling conveyance vehicle 20 to when the ceiling conveyance vehicle 20 to which the conveyance instruction has been allocated reaches a collection point (the From point) in order to collect the FOUP 90. The conveyance controller 41 acquires a vehicle allocating time measured by the ceiling conveyance vehicle controller 42 and is thus able to calculate the average vehicle allocating time for each of the semiconductor processing apparatuses 100, for example.

As described in the second example described above, when the average vehicle allocating time is short, the operating rate of the semiconductor processing apparatus 100 may improve by prioritizing supply of the unprocessed FOUP 90 to the apparatus port 101 rather than collection of the processed FOUP 90 from the apparatus port 101. In contrast, when the average vehicle allocating time is long, the operating rate of the semiconductor processing apparatus 100 may improve by prioritizing collection of the processed FOUP 90 from the apparatus port 101 rather than supply of the unprocessed FOUP 90 to the apparatus port 101. Given these circumstances, the conveyance controller 41 calculates the average vehicle allocating time of the semiconductor processing apparatus 100 for each of the semiconductor processing apparatuses 100 and switches the operation mode of the storage apparatus 30 corresponding to the semiconductor processing apparatus 100 to the first mode if the average vehicle allocating time is shorter than a threshold d5 set in advance. In contrast, if the average vehicle allocating time of the semiconductor processing apparatus 100 is larger than a threshold d6 (d6>d5) set in advance, the conveyance controller switches the operation mode of the storage apparatus 30 corresponding to the semiconductor processing apparatus 100 to the second mode. If the average vehicle allocating time of the semiconductor processing apparatus 100 falls between the threshold d5 and the threshold d6, the conveyance controller 41 switches the operation mode of the storage apparatus 30 corresponding to the semiconductor processing apparatus 100 to the third mode in order to perform supply and collection of the FOUP 90 with a good balance.

In the third example described above, the average vehicle allocating time of the semiconductor processing apparatus 100 corresponds to the operation status information, whereas the rule described above setting any of the first to the third modes based on the average vehicle allocating time and the result of the comparison operation with the thresholds d5 and d6 corresponds to the switching rule. In the third example described above, a vehicle allocating time for a processed FOUP 90 freely selected may be used in place of the average vehicle allocating time. A representative value other than the average vehicle allocating time (the median of the vehicle allocating time, for example) may be used.

As shown in the first to the third examples, the conveyance controller 41 is configured or programmed to automatically switch the operation mode based on the operation status information and the switching rule set in advance, such that an appropriate operation mode is able to be switched automatically in accordance with the operation status of the conveyance system 1. In addition, the simple processing to compare the operation status information and the threshold set in advance is able to switch the operation modes of the respective storage apparatuses 30 automatically and appropriately. The first to the third examples are by way of example, and the conveyance controller 41 may switch the operation mode based on operation status information and a switching rule other than those exemplified above.

As described above, in the conveyance system 1, the conveyance controller 41 is able to switch the operation mode among the first and second modes that restrict one of the transfer operations enabled by the local vehicle 32 (that is, the transfer operation from the apparatus port 101 to the storage part 31 and the transfer operation from the storage part 31 to the apparatus port 101) and the third mode that does not restrict the transfer operations of the local vehicle 32 as the operation mode. In the conveyance system 1, the operation mode is set to the first mode, such that supply of the FOUP 90 to the apparatus port 101 is prioritized. The operation mode is set to the second mode, such that collection (evacuation to the second storage part 31B) of the FOUP 90 from the apparatus port 101 is prioritized. The operation mode is set to the third mode, such that supply and collection of the FOUP 90 is able to be executed with a good balance. Consequently, the conveyance system 1 switches the operation mode of the conveyance controller 41 in accordance with the status of the conveyance system 1, thus appropriately switches the priority of supply and collection of the FOUP 90, and improves the operating rate of the semiconductor processing apparatus 100.

In the conveyance system 1, the storage part 31 includes the first storage part 31A provided on the upstream side of the apparatus port 101 in the travel direction A of the ceiling conveyance vehicles 20 and the second storage part 31B provided on the downstream side of the apparatus port 101 in the travel direction A of the ceiling conveyance vehicles 20. The conveyance controller 41 prohibits the transfer operation to transfer the FOUP 90 to the second storage part 31B by any of the ceiling conveyance vehicles 20 and prohibits the transfer operation to transfer the FOUP 90 from the apparatus port 101 to the first storage part 31A by the local vehicle 32. With this prohibition, in any of the first to the third modes, the FOUP 90 is able to be transferred in one direction from the upstream side to the downstream side in the travel direction of the ceiling conveyance vehicles 20. Consequently, in the range of transfer operations enabled in the respective modes, one ceiling conveyance vehicle 20 is able to supply the FOUP 90 to the upstream port (the first storage part 31A or the apparatus port 101) and collect the processed FOUP 90 placed on the downstream port (the apparatus port 101 or the second storage part 31B). Consequently, the conveyance system 1 also improves the operating efficiency of the ceiling conveyance vehicles 20.

In the conveyance system 1, the conveyance controller 41 is able to switch the operation mode for each of the storage apparatuses 30. With this configuration, the operation mode is able to be switched appropriately for each of the storage apparatuses 30 in accordance with the status of each of the storage apparatuses 30 (that is, each of the semiconductor processing apparatuses 100).

In the conveyance system 1, the conveyance controller 41 is configured or programmed to receive an instruction to request switching of the operation mode by the operator via the management terminal T and switch the operation mode in accordance with the received instruction. With this configuration, a manual instruction by the operator or the like is able to timely switch the operation mode.

In the conveyance system 1, the conveyance controller 41 is able to regularly acquire the operation status information on the operation status of the conveyance system 1 and automatically switch the operation mode based on the operation status information and the switching rule set in advance. With this configuration, switching to an appropriate operation mode is able to be achieved automatically in accordance with the operation status of the conveyance system 1.

Although preferred embodiments of the present invention have been described, the present disclosure is not limited thereto. The configuration of the storage apparatus 30 illustrated in FIG. 1 and FIG. 2 is by way of example only, and the arrangement and configuration of the storage part 31 and the local vehicle 32 can be freely designed, for example. In addition, the number of the apparatus ports 101 provided in one semiconductor processing apparatus 100 is not limited to two exemplified in the above preferred embodiments, and may be one or three or more. Further, the number of the storage parts 31 provided in one storage apparatus 30 is also not limited to two, and may be one or three or more.

The control configuration illustrated in FIG. 3 is by way of example, and the control system of the controllers is not necessarily required to match the hierarchical structure illustrated in FIG. 3. The storage apparatus controller 43 for each of the storage apparatuses 30 may be a single controller common to the storage apparatuses 30, for example. Similarly, the conveyance controller 41, the ceiling conveyance vehicle controller 42, and the storage apparatus controller 43 may be a single controller.

The conveyed object that the conveyance systems according to preferred embodiments of the present invention convey is not limited to the FOUP housing a plurality of semiconductor wafers and may be another container housing glass wafers, reticles, or the like. The conveyance systems according to preferred embodiments of the present invention is not limited to semiconductor manufacturing factories, but can be used also for other facilities.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A conveyance system comprising:
    a track;
    a plurality of conveyance vehicles to travel along the track and convey a conveyed object;
    a storage apparatus including:
        a storage plate to and from which any of the plurality of conveyance vehicles is configured to deliver the conveyed object; and
        a local vehicle capable of transferring the conveyed object between the storage plate and an apparatus port, wherein any of the plurality of conveyance vehicles is configured to deliver the conveyed object to and from the apparatus port; and
    a controller configured or programmed to control operations of the plurality of conveyance vehicles and the local vehicle in accordance with an operation mode,
    the controller being configured or programmed to switch the operation mode among:
        a first mode that prohibits a transfer operation to transfer the conveyed object from the apparatus port to the storage plate by the local vehicle;
        a second mode that prohibits: a transfer operation to transfer the conveyed object to the storage plate by any of the plurality of conveyance vehicles, and a transfer operation to transfer the conveyed object from the storage plate to the apparatus port by the local vehicle; and
        a third mode that allows both: the transfer operation to transfer the conveyed object from the apparatus port to the storage plate by the local vehicle, and the transfer operation to transfer the conveyed object from the storage plate to the apparatus port by the local vehicle.

2. The conveyance system according to claim 1, wherein
the storage plate includes a first storage plate provided on an upstream side of the apparatus port in a travel direction of the plurality of conveyance vehicles and a second storage plate provided on a downstream side of the apparatus port in the travel direction of the plurality of conveyance vehicles, and the controller prohibits a transfer operation for the conveyed object to the second storage plate by any of the plurality of conveyance vehicles and prohibits a transfer operation from the apparatus port to the first storage plate by the local vehicle.

3. The conveyance system according to claim 1, wherein the controller is configured or programmed to switch the operation mode for each of a plurality of the storage apparatuses.

4. The conveyance system according to claim 1, wherein the controller is configured or programmed to receive an operation to request switching of the operation mode and switch the operation mode in accordance with the received operation.

5. The conveyance system according to claim 1, wherein the controller regularly acquires operation status information on an operation status of the conveyance system and automatically switches the operation mode based on the operation status information and a switching rule set in advance.

6. The conveyance system according to claim 5, wherein the controller acquires, as the operation status information, a processing time for one conveyed object at the apparatus port, executes a comparison operation based on the processing time and a threshold set in advance, and switches the operation mode for the storage apparatus allowing the conveyed object to be transferred to and from the apparatus port by the local vehicle based on a result of the comparison operation.

7. The conveyance system according to claim 5, wherein the controller acquires, as the operation status information, an operating number of the plurality of conveyance vehicles in operation in an area containing the storage apparatus, executes a comparison operation based on the operating number and a threshold set in advance, and switches the operation mode for the storage apparatus based on a result of the comparison operation.

8. The conveyance system according to claim 5, wherein the controller acquires, as the operation status information, a vehicle allocating time of any of the plurality of conveyance vehicles collecting the conveyed object after being processed from the storage plate of the storage apparatus or the apparatus port allowing the conveyed object to be transferred to and from the storage plate by the local vehicle, executes a comparison operation based on the vehicle allocating time and a threshold set in advance, and switches the operation mode for the storage apparatus based on a result of the comparison operation.

* * * * *